(12) United States Patent
Park (10) Patent No.: US 7,199,043 B2
(45) Date of Patent: Apr. 3, 2007

(54) METHOD OF FORMING COPPER WIRING IN SEMICONDUCTOR DEVICE

(75) Inventor: Sang Kyun Park, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/749,022

(22) Filed: Dec. 30, 2003

(65) Prior Publication Data

US 2005/0009339 A1    Jan. 13, 2005

(30) Foreign Application Priority Data

Jul. 9, 2003   (KR) .................. 10-2003-0046291
Jul. 9, 2003   (KR) .................. 10-2003-0046292

(51) Int. Cl.
*H01L 21/4763*   (2006.01)
*H01L 21/44*     (2006.01)
*H01L 21/4764*   (2006.01)

(52) U.S. Cl. ............... 438/625; 438/626; 438/627; 438/629; 438/631; 438/632; 438/633; 438/637; 438/638; 438/639; 438/640; 438/641; 438/642; 438/643; 438/645; 438/646; 438/648; 438/649; 438/650; 438/651; 438/653; 438/656; 438/657; 438/658; 438/659; 438/660; 438/663; 438/664; 438/665; 438/666; 438/667; 438/668; 438/669; 438/672; 438/673; 438/674; 438/675; 438/676; 438/677; 438/678; 438/680; 438/681; 438/682; 438/683; 438/684; 438/685; 438/686; 438/687; 257/E21.304; 257/E21.319; 257/E21.166; 257/E21.195

(58) Field of Classification Search ........ 438/625–627, 438/629, 631–633, 637, 643, 645–646, 648, 438/653, 656, 660, 663, 669, 672, 687, 692, 438/700

See application file for complete search history.

(56) References Cited

U.S. PATENT DOCUMENTS 5,451,551 A * 9/1995 Krishnan et al. ........... 438/626

(Continued)

FOREIGN PATENT DOCUMENTS

JP    2002329780      11/2002
KR    20010026464 A    4/2001

OTHER PUBLICATIONS

Office Action issued from Korean Intellectual Property Office on Jul. 11, 2005 (3 pages).

*Primary Examiner*—Michael Lebentritt
*Assistant Examiner*—Mohsen Ahmadi
(74) *Attorney, Agent, or Firm*—Marshall Gerstein & Borun (57) ABSTRACT

Disclosed in a method of forming a copper wiring in a semiconductor device. A copper layer buries a damascene pattern in which an interlayer insulating film of a low dielectric constant. The copper layer is polished by means of a chemical mechanical polishing process to form a copper wiring within a damascene pattern. At this time, the chemical mechanical polishing process is overly performed so that the top surface of the copper wiring is concaved and is lower than the surface of the interlayer insulating film of the low dielectric constant neighboring it. Furthermore, an annealing process is performed so that the top surface of the copper wiring is changed from the concaved shape to a convex shape while stabilizing the copper wiring. A copper anti-diffusion insulating film is then formed on the entire structure including the top surface of the copper wiring having the convex shape. As such, the copper anti-diffusion insulating film is formed not only within the damascene pattern but also on the entire structure, thus serving as a barrier to prohibit electro-migration and stress migration of copper. It is thus possible to improve reliability of the wiring. In addition, the entire surface including the top surface of the copper wiring is polished without a step to facilitate a photolithography process, an etch process, etc. that are subsequently performed. It is therefore possible to improve reliability in process.

21 Claims, 4 Drawing Sheets

U.S. PATENT DOCUMENTS

| | | | |
|---|---|---|---|
| 6,051,496 A * | 4/2000 | Jang | 438/687 |
| 6,083,835 A * | 7/2000 | Shue et al. | 438/687 |
| 6,184,138 B1 * | 2/2001 | Ho et al. | 438/687 |
| 6,251,786 B1 * | 6/2001 | Zhou et al. | 438/692 |
| 6,274,499 B1 * | 8/2001 | Gupta et al. | 438/692 |
| 6,387,806 B1 * | 5/2002 | Wang et al. | 438/687 |
| 6,492,266 B1 | 12/2002 | Ngo et al. | |
| 6,528,409 B1 | 3/2003 | Lopatin et al. | |
| 6,579,785 B2 * | 6/2003 | Toyoda et al. | 438/597 |
| 6,599,827 B1 | 7/2003 | Ngo et al. | |
| 2001/0013617 A1 * | 8/2001 | Toyoda et al. | 257/301 |
| 2003/0087513 A1 * | 5/2003 | Noguchi et al. | 438/627 |
| 2003/0109129 A1 * | 6/2003 | Saito et al. | 438/627 |
| 2003/0114000 A1 * | 6/2003 | Noguchi | 438/687 |
| 2004/0121583 A1 * | 6/2004 | Bao et al. | 438/627 |
| 2005/0085066 A1 * | 4/2005 | Tsao et al. | 438/633 |

* cited by examiner

METHOD OF FORMING COPPER WIRING IN SEMICONDUCTOR DEVICE

BACKGROUND

1. Technical Field

Methods of forming a copper wiring in a semiconductor device are disclosed which are capable of preventing an electrical short condition between neighboring copper wirings and facilitating subsequent processes. The disclosed methods accomplish this through surface polishing, and by prohibiting electro-migration and stress migration of copper in the copper wiring formed within a damascene pattern.

2. Discussion of Related Art

Generally, as the semiconductor industry shifts to an ultra large-scale integration (ULSI) level, the geometry of the devices continue to be narrowed to a sub-half-micron region. In view of improved performance and reliability, circuit density is gradually increased. Copper has a high resistance to electro-migration (EM) since it has a higher melting point than aluminum. Thus, copper can improve reliability of the devices. Further, copper can increase a signal transfer speed since it has a low resistivity. For this reason, in forming a metal wiring in a semiconductor device, copper has been used as an interconnection material useful for an integration circuit.

Methods of burying copper that may be used currently include physical vapor deposition (PVD) method/a reflow, chemical vapor deposition (CVD), electroplating, electroless-plating, and the like. Preferred methods are electroplating and CVD, both of which have a relatively good copper burial characteristic.

While copper is used as a material of a metal wiring, a damascene scheme for simultaneously forming a via contact hole for electrical connection to a lower layer and a trench in which the metal wiring is located, has been widely used along with a process of forming a copper wiring in a semiconductor device. A low-dielectric insulating material having a low dielectric constant is used as an interlayer insulating film in which a damascene pattern will be formed.

In order to form a copper wiring in the damascene pattern having the via contact hole and the trench, copper is buried into the damascene pattern through several methods and the buried copper layer is then polished by a chemical mechanical polishing (CMP) process, so that the buried copper layer is isolated from neighboring copper wirings.

Figure 1:
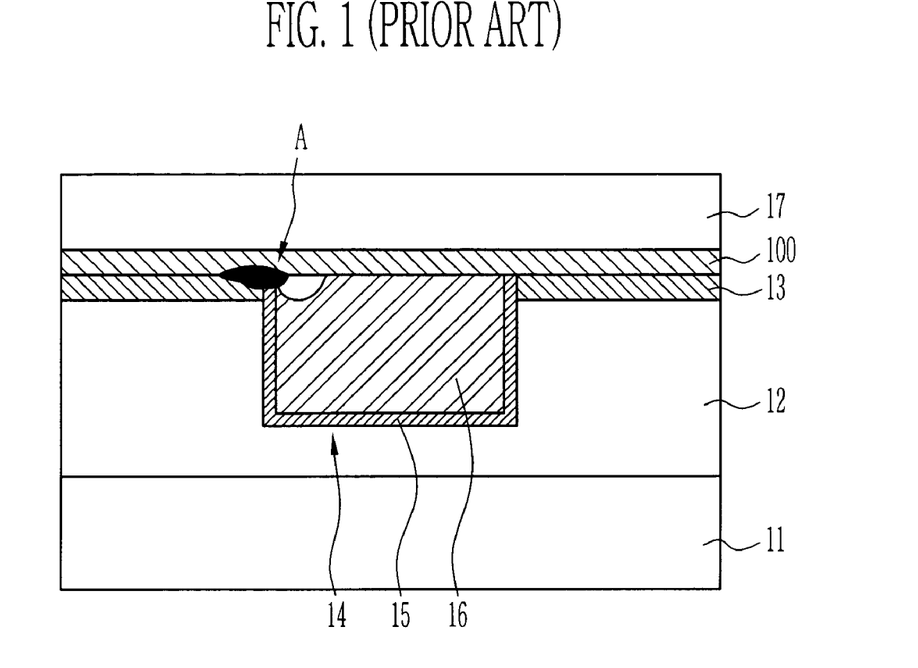
FIG. 1 is a sectional view for explaining a method of forming a copper wiring in a semiconductor device according to a prior art.

FIG. 1 is a sectional view for explaining the conventional method of forming the copper wiring.

A first interlayer insulating film 12 and an anti-polishing layer 13 are formed on a substrate 11. The anti-polishing layer 13 and the first interlayer insulating film 12 are etched by a damascene scheme to form a damascene pattern 14. A copper anti-diffusion conductive film 15 is formed along the surface of the anti-polishing layer 13 including the damascene pattern 14. A copper layer is formed to sufficiently bury the damascene pattern 14. A CMP process is then performed until the anti-polishing layer 13 is exposed, thus forming a copper wiring 16 within the damascene pattern 14. Thereafter, a copper anti-diffusion insulating film 100 and a second interlayer insulating film 17 are formed on the entire structure including the copper wiring 16.

In the above-mentioned method, in order to prevent diffusion of copper elements from the copper wiring 16, the copper wiring 16 is sealed using the copper anti-diffusion conductive film 15 and the copper anti-diffusion insulating film 100. In a device having the copper wiring 16 formed by a conventional method, however, most of defective wirings are generated due to electro-migration and stress migration that take place at the interface between the copper anti-diffusion insulating film 100 and the copper anti-diffusion conductive film 15, as indicated by an arrow "A". This condition is caused by a lack in the bondability between the copper anti-diffusion insulating film 100 and the underlying layers 13, 15 and 16.

SUMMARY OF THE DISCLOSURE

A method of forming a copper wiring within a damascene pattern is disclosed which is capable of enhancing the electrical properties, preventing an electrical short between neighboring copper wirings and facilitating subsequent processes through surface polishing, by preventing electro-migration and by preventing stress migration of copper in the copper wiring.

According to a preferred embodiment, a disclosed method of forming a copper wiring comprises providing a substrate in which a damascene pattern is formed in an interlayer insulating film, forming a copper anti-diffusion conductive film and a copper layer on the entire structure including the damascene pattern, forming a copper wiring by means of a chemical mechanical polishing process, wherein the surface of the copper wiring is lower than the surface of the interlayer insulating film, and forming a copper anti-diffusion insulating film on the entire structure including the top of the copper wiring.

In the above method, the copper anti-diffusion insulating film may be formed by covering materials such as methyl, benzochlorobutane, polyimide, arylether and hydrogen silsesquioxane, which contain Si, C and N in a type of a sol or gel, and then performing an annealing process in order to densify the covered film. In the above method, the annealing process may be performed using an inert gas such as $N_2$, Ar, $H_2$ or He or a mixed gas of them at a temperature of 100 to 500° C.

According to another embodiment, a method of forming a copper wiring comprises providing a substrate in which a damascene pattern is formed in an interlayer insulating film, a second step of forming a copper anti-diffusion conductive film and a copper layer on the entire structure including the damascene pattern, a third step of forming a copper wiring by means of a chemical mechanical polishing process, wherein the surface of the copper wiring is lower than the surface of the interlayer insulating film, and a fourth step of plasma-processing the surface of the copper wiring and then forming a selective copper anti-diffusion conductive film on the plasma-processed surface.

In the above method, the third step includes the steps of overly performing a chemical mechanical polishing process so that the top surface of the copper wiring is concaved and formed lower than the surface of the interlayer insulating film, and performing an annealing process so that the top surface of the copper wiring is changed from the concave shape to a convex shape while stabilizing the copper wiring.

The annealing process may be performed using an inert gas such as $N_2$, Ar, $H_2$ or He or a mixed gas of them at a temperature of 100 to 500° C., or may be performed using an inert gas of $N_2$, Ar, $H_2$ or He or a mixed gas of them or in a vacuum state at a temperature range of 200 to 700° C. for 1 to 5 minutes in a rapid thermal annealing process.

DETAILED DESCRIPTION OF THE PREFERRED EMBODIMENTS

Now the preferred embodiments will be described with reference to the accompanying drawings. Since preferred embodiments are provided for the purpose of understanding for those skilled in the art, they may be modified in various manners and the scope of this disclosure is not limited by the preferred embodiments described herein.

Figure 2A:
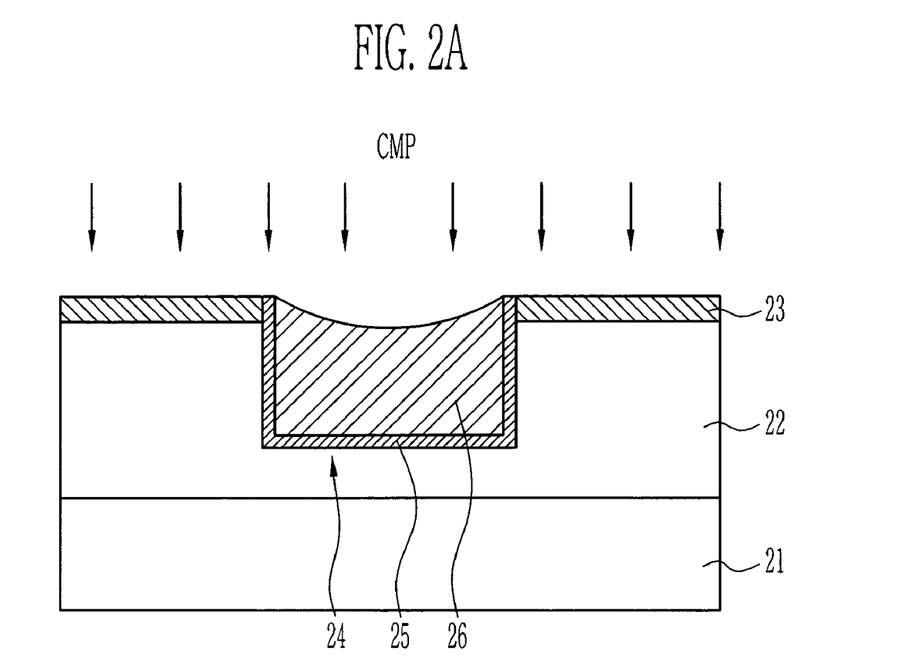
FIGS. 2A to 2C are sectional views for explaining a method of forming a copper wiring in a semiconductor device according to one embodiment.
Figure 2B:
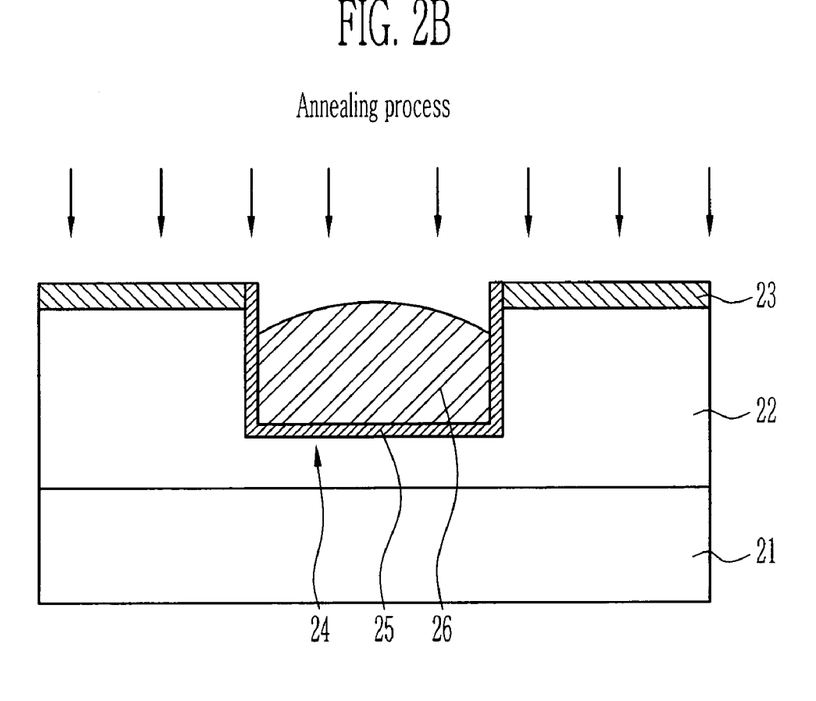
Figure 2C:
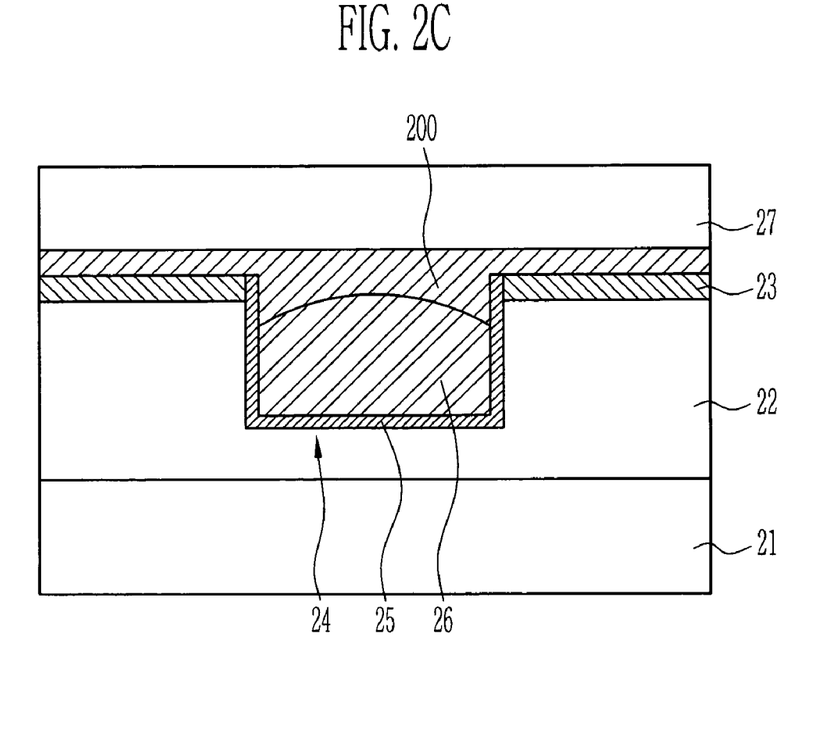

FIGS. 2A to 2C are sectional views for explaining a disclosed method of forming a copper wiring in a semiconductor device.

Referring to FIG. 2A, a first interlayer insulating film 22 and an anti-polishing layer 23 are formed on a substrate 21. The anti-polishing layer 23 and the first interlayer insulating film 22 are etched by a damascene scheme to form a damascene pattern 24. A copper anti-diffusion conductive film 25 is then formed along the surface of the anti-polishing layer 23 including the damascene pattern 24. A copper layer is formed enough to sufficiently bury the damascene pattern 24. The copper layer is formed by plating copper directly on the copper anti-diffusion conductive film 25, or forming a copper seed layer (not shown) on the copper anti-diffusion conductive film 25 and then plating copper. The copper seed layer is formed by means of an ionized PVD, CVD, or electroless copper plating method with a thickness in the range of 50~300 nm. Thereafter, a CMP process is performed to form a copper wiring 26 within the damascene pattern 24. In this case, the CMP process is overly performed so that the top surface of the copper wiring 26 is concaved and is lower than the surface of the first interlayer insulating film 22 neighboring it. After the CMP process is completed, a cleaning process is performed.

In the above, the first interlayer insulating film 22 is formed using a material having a low dielectric constant in order to solve problems due to parasitic capacitance between the wirings. For example, the first interlayer insulating film 22 may be formed using a material in which H, F, C, $CH_3$, etc. are partially mixed in $SiO_2$ series having a dielectric constant of 1.5 to 4.5, an organic material such as SiLK™ product, Flare™ product, etc., which have C—H as a basic structure, and a porous material whose porosity is increased in order to lower the dielectric constant of the above materials.

The anti-polishing layer 23 may be formed using oxides not containing carbon. Further, the anti-polishing layer 23 may be formed using silicon nitride and silicon nitride oxide containing nitrogen or a series of silicon carbide containing carbon, by means of a chemical vapor deposition (CVD) method so that they have a copper anti-diffusion property.

The copper anti-diffusion conductive film 25 may be formed by one of ionized PVD TiN, CVD TiN, MOCVD TiN, ionized PVD Ta, ionized PVD TaN, CVD Ta, CVD TaN and CVD WN, or a combination of them.

The cleaning process may be performed using a cleaning agent containing a small amount of nitric acid, etc. so that the surface of the copper wiring 26 is further lower than the surface of the first interlayer insulating film 22 neighboring it.

By reference to FIG. 2B, a first annealing process is performed to stabilize the copper wiring 26. In the case, the top surface of the copper wiring 26 is changed from the concave shape to a convex shape so as to minimize surface energy due to heat.

In the above, the first annealing process is performed in two methods. The first method is performed using an inert gas of $N_2$, Ar, $H_2$, or He, etc., or a mixed gas of them at a temperature range of 100 to 500° C. The second method is performed using an inert gas of $N_2$, Ar, $H_2$, or He, etc., or a mixed gas of them or in a vacuum state at a temperature range of 200 to 700° C. for 5 or fewer minutes, preferably for 1 to 5 minutes in a rapid thermal annealing process.

With reference to FIG. 2C, in order to remove impurities such as an oxide layer generated on the surface of the copper wiring 26, a plasma process is performed and a copper anti-diffusion insulating film 200 is formed on the entire structure including the top surface of the copper wiring 26 having the convex shape. A second interlayer insulating film 27 is then formed on the entire structure including the copper anti-diffusion insulating film 200.

In the above, the plasma processing is carried out using a mixed gas containing nitrogen and hydrogen, a gas of a series of ammonia, or a mixed gas of hydrogen/an inert gas not containing nitrogen as an atmosphere gas at a temperature range of 100 to 350° C.

In the above, the copper anti-diffusion insulating film 200 is formed using a material for which surface polishing can be easily performed, while having a copper anti-diffusion property. That is, the copper anti-diffusion insulating film 200 is formed by covering source materials such as methyl, benzochlorobutane, polyimide, arylether, hydrogen silsesquioxane, and the like, which contain Si, C, N, etc. in a type of a sol or gel having a good fluidity property, in a thickness of 300Å or more, preferably in the range of 300 to 700° C. by means of a spin-on deposition mode, and then performing a second annealing process to densify the covered film. In this case, the second annealing process is performed in two methods. The first method is performed using an inert gas of $N_2$, Ar, $H_2$, He, etc., or a mixed gas of them at a temperature range of 100 to 500° C., for 1 or more minutes, preferably 1 to 5 minutes. The second method is performed in a vacuum state at a temperature range of 100 to 500° C. for 1 or more minutes, preferably for 1 to 5 minutes.

In case of a multi-layer metal wiring structure, it is preferred that the second interlayer insulating film 27 is formed using a material having a low dielectric constant in order to solve the problems due to the parasitic capacitor among the wirings as in the mentioned first interlayer insulating film 22. In case of a single layer metal wiring structure, however, it may be preferred that the second interlayer insulating film 27 is formed using a material that is usually used to form an interlayer insulating film of a semiconductor device.

Figure 3A:
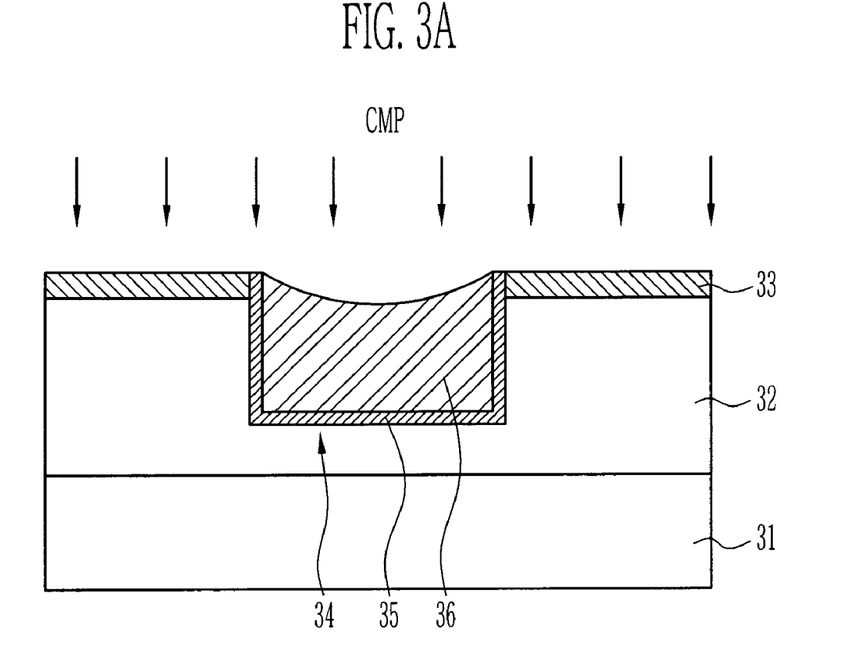
FIGS. 3A to 3C are sectional views for explaining a method of forming a copper wiring in a semiconductor device according to another embodiment.
Figure 3B:
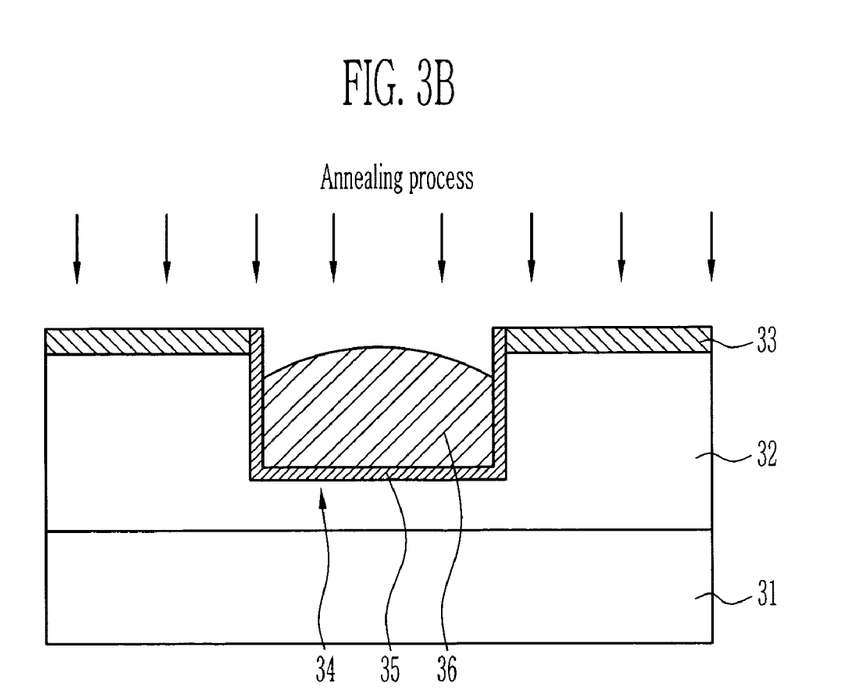
Figure 3C:
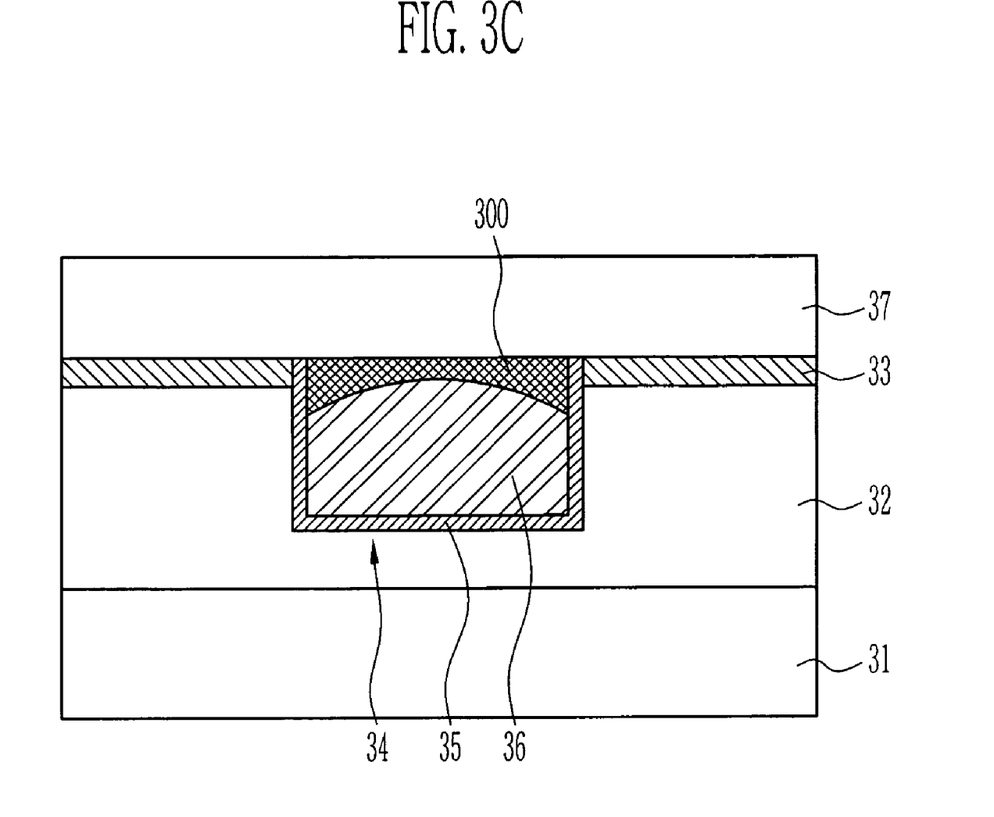

FIGS. 3A to 3C are sectional views for explaining another method of forming a copper wiring in a semiconductor device.

Referring to FIG. 3A, a first interlayer insulating film 32 and an anti-polishing layer 33 are formed on a substrate 31. The anti-polishing layer 33 and the first interlayer insulating film 32 are etched by a damascene scheme to form a damascene pattern 34. A copper anti-diffusion conductive film 35 is then formed along the surface of the anti-polishing layer 33 including the damascene pattern 34. A copper layer is formed enough to sufficiently bury the damascene pattern 34. Thereafter, a CMP process is performed to form a copper wiring 36 within the damascene pattern 34. In this case, the CMP process is overly performed so that the top surface of the copper wiring 36 is concaved and is lower than the first interlayer insulating film 32 neighboring it. After the CMP process is completed, a cleaning process is performed.

In the above, the first interlayer insulating film 32 is formed using a material having a low dielectric constant in order to solve problems due to parasitic capacitance between the wirings. For example, the first interlayer insulating film 32 may be formed using a material in which H, F, C, $CH_3$, etc. are partially mixed in $SiO_2$ series having a dielectric constant of 1.5 to 4.5, an organic material such as SiLK™ product, Flare™ product, etc., which have C—H as a basic structure, and a porous material whose porosity is increased in order to lower the dielectric constant of the above materials.

The anti-polishing layer 33 may be formed using oxides not containing carbon. Further, the anti-polishing layer 33 may be formed using silicon nitride and silicon nitride oxide containing nitrogen or a series of silicon carbide containing carbon, by means of a CVD method so that they have a copper anti-diffusion property.

The copper anti-diffusion conductive film 35 may be formed by one of ionized PVD TiN, CVD TiN, MOCVD TiN, ionized PVD Ta, ionized PVD TaN, CVD Ta, CVD TaN and CVD WN, or a combination of them.

The cleaning process may be performed using a cleaning agent containing a small amount of nitric acid, etc. so that the surface of the copper wiring 36 is further lower than the surface of the first interlayer insulating film 32 neighboring it.

By reference to FIG. 3B, an annealing process is performed to stabilize the copper wiring 36. In this case, the top surface of the copper wiring 36 is changed from the concave shape to a convex shape so as to minimize surface energy due to heat.

In the above, the annealing process is performed in two methods. The first method is performed using an inert gas of $N_2$, Ar, $H_2$, He, etc. or a mixed gas of them at a temperature range of 100 to 500° C. The second method is performed using an inert gas of $N_2$, Ar, $H_2$, He, etc. or a mixed gas of them or in a vacuum state at a temperature range of 200 to 700° C. for 5 or fewer minutes, preferably for 1 to 5 minutes in a rapid thermal annealing process.

With reference to FIG. 3C, in order to remove impurities such as an oxide layer generated on the surface of the copper wiring 36, plasma is processed and a selective copper anti-diffusion conductive film 300 is formed on the entire structure including the top surface of the copper wiring 36 having the convex shape. A second interlayer insulating film 37 is then formed on the entire structure including the copper anti-diffusion conductive film 300.

In the above, the plasma processing is carried out using a mixed gas containing nitrogen and hydrogen, a gas of a series of ammonia, or a mixed gas of hydrogen/an inert gas not containing nitrogen as an atmosphere gas at a temperature range of 100 to 350° C.

It is required that the selective copper anti-diffusion conductive film 300 be formed within the damascene pattern 34 without causing a step with the first interlayer insulating film 32 neighboring it. Furthermore, the selective copper anti-diffusion conductive film 300 is formed in two methods. The first method is performed using a metal having a high melting point such as W, Ti, Ta, etc or a compound such as Ni, Co, P, B, etc. by means of a selective electroless plating method. The second method is performed by means of a selective CVD method.

In case of a multi-layer metal wiring structure, it is preferred that the second interlayer insulating film 37 is formed using a material having a low dielectric constant in order to solve the problems due to the parasitic capacitor among the wirings as in the mentioned first interlayer insulating film 32. In case of a single layer metal wiring structure, however, it may be preferred that the second interlayer insulating film 37 is formed using a material that is usually used to form an interlayer insulating film of a semiconductor device.

According to the first embodiment described above, a copper anti-diffusion insulating film is formed not only within a damascene pattern but also on the entire structure, thus serving as a barrier to prohibit electro-migration and stress migration of copper. It is thus possible to improve reliability of a wiring. Furthermore, the whole plane including an upper side of a copper wiring is polished without a step to facilitate a photolithography process, an etch process, etc. that are subsequent performed. It is therefore possible to improve reliability in process.

According to the second embodiment described above, the top surface of a copper wiring is lower than the surface of an interlayer insulating film of a low dielectric constant neighboring it and a selective copper anti-diffusion conductive film on the copper wiring is formed within a damascene pattern without causing a step with an interlayer insulating film of a dielectric constant neighboring it. As the selective copper anti-diffusion conductive film serves as a barrier to prohibit electro-migration and stress migration of copper, it is possible to improve reliability of the wiring. Furthermore, the selective copper anti-diffusion conductive film is formed only within the damascene pattern to prevent an electrical short condition among neighboring copper wirings. It is thus possible to improve wiring fail. Therefore, the present invention has advantages that it can enhance electrical properties and reliability of devices and makes it possible to realize higher-integration of the device.

Although the foregoing description has been made with reference to the preferred embodiments, it is to be understood that changes and modifications of the disclosed methods may be made by the ordinary skilled in the art without departing from the spirit and scope of this disclosure and the appended claims.

What is claimed is:

1. A method of forming a copper wiring in a semiconductor device, comprising:
   providing a substrate in which a damascene pattern is formed in an interlayer insulating film;
   forming a copper anti-diffusion conductive film and a copper layer on the structure including the damascene pattern;
   forming a copper wiring in the damascene pattern by means of a chemical mechanical polishing process, wherein the chemical mechanical polishing process is performed until a top surface of the copper wiring is concave from a top view and the top surface of the copper wiring has a lowermost portion disposed below a top surface on the interlayer insulating film;
   performing an annealing process to convert the concave top surface of the copper wiring to a convex top surface so that side edges of the copper wiring that engage the copper anti-diffusion conductive film are disposed below a top surface of the interlayer insulating film, wherein the annealing process is performed using an inert gas of $N_2$, Ar, $H_2$ or He or a mixture thereof, or in a vacuum state at a temperature in the range of 100° C. to 700° C. in a thermal annealing process; and forming a copper anti-diffusion insulating film on the entire structure including the convex the top surface of the copper wiring having the convex shape, thereby flatting a surface of the entire structure.

2. The method as claimed in claim 1, further comprising the step of performing a cleaning process after the step of performing the chemical mechanical polishing process.

3. The method as claimed in claim 2, wherein the cleaning process is performed using a cleaning agent containing nitric acid so that the surface of the copper wiring is further lower than the surface of the interlayer insulating film.

4. The method as claimed in claim 1, wherein the annealing process is performed in an inert gas atmosphere such as $N_2$, Ar, $H_2$ or He or a mixture thereof at a temperature in the range of 100° C. to 500° C.

5. The method as claimed in claim 1, wherein a plasma processing is further performed between the fourth step and the fifth step.

6. The method as claimed in claim 5, wherein the plasma processing is carried out using a mixed gas containing nitrogen and hydrogen, a gas of a series of ammonia, or a mixed gas of hydrogen/an inert gas not containing nitrogen as an atmosphere gas at a temperature in the range of 100° C. to 350° C.

7. The method as claimed in claim 1, wherein the copper anti-diffusion insulating film is formed by covering a material having a copper anti-diffusion property and a good fluidity property by means of a spin-on-deposition method, and then performing an annealing process for the material.

8. The method as claimed in claim 7, wherein the copper anti-diffusion insulating film is formed using materials such as methyl, benzochlorobutane, polyimide, arylether and hydrogen silsesquioxane, which contain Si, C and N in a type of a sol or gel.

9. The method as claimed in claim 7, wherein the annealing process is performed using an inert gas such as $N_2$, Ar, $H_2$ or He or a mixed gas of them at a temperature in the range of 100° C. to 500° C.

10. The method as claimed in claim 7, wherein the annealing process is performed in a vacuum state at a temperature in the range of 100° C. to 500° C.

11. A method of forming a copper wiring in a semiconductor device, comprising:
sequentially forming an interlayer insulating film and an anti-polishing layer on a substrate;
forming a damascene pattern in the interlayer insulating film by etching a given region of the anti-polishing layer and the interlayer insulating film;
forming a copper anti-diffusion conductive film and a copper layer on the structure including the damascene pattern;
forming a copper wiring by means of a chemical mechanical polishing process, wherein the chemical mechanical polishing process is performed until a top surface of the copper wiring is concave from a top view and the top surface of the copper wiring has a lowermost portion disposed below a top surface of the interlayer insulating film;
performing an annealing process to convert tile concave top surface of the copper wiring to a convex top surface so that side edges of the copper wiring that engage the copper anti-diffusion conductive film are disposed below a top surface of the interlayer insulating film, and wherein the annealing process is performed in an inert gas atmosphere of $N_2$, Ar, $H_2$ or He or a mixture thereof, or in a vacuum state and at a temperature in the range of 100° C. to 700° C.; and
forming a selective copper anti-diffusion conductive film on the convex-top surface of the copper wiring having the convex shape.

12. The method as claimed in claim 11, further comprising the step of performing a cleaning process after the step of performing the chemical mechanical polishing process.

13. The method as claimed in claim 12, wherein the cleaning process is performed using a cleaning agent containing nitric acid so that the surface of the copper wiring is further lower than the surface of the interlayer insulating film.

14. The method as claimed in claim 11, wherein the annealing process is performed in an inert gas atmosphere such as $N_2$, Ar, $H_2$ or He or a mixture thereof and at a temperature in the range of 100° C. to 500° C.

15. The method as claimed in claim 11, wherein a plasma processing is further performed between the fourth step and the fifth step.

16. The method as claimed in claim 15, wherein the plasma processing is carried out using a mixed gas containing nitrogen and hydrogen, a gas of a series of ammonia, or a mixed gas of hydrogen/an inert gas not containing nitrogen as an atmosphere gas at a temperature in the range of 100° C. to 350° C.

17. The method as claimed in claim 11, wherein the selective copper anti-diffusion conductive film is formed within the damascene pattern without causing a step with the interlayer insulating film.

18. The method as claimed in claim 17, the selective copper anti-diffusion conductive film is formed using a metal having a high melting point such as W, Ti, Ta, etc. or a compound such as Ni, Co, P, B, etc. by means of a selective electroless plating method.

19. The method as claimed in claim 17, the selective copper anti-diffusion conductive film is formed by means of a selective chemical vapor deposition (CVD) method.

20. The method as claimed in claim 11, the selective copper anti-diffusion conductive film is formed using a metal having a high melting point such as W, Ti, Ta, etc. or a compound such as Ni, Co, P, B, etc. by means of a selective electroless plating method.

21. The method as claimed in claim 11, the selective copper anti-diffusion conductive film is formed by means of a selective chemical vapor deposition (CVD) method.

* * * * *

UNITED STATES PATENT AND TRADEMARK OFFICE
CERTIFICATE OF CORRECTION

| | |
|---|---|
| PATENT NO. | : 7,199,043 B2 |
| APPLICATION NO. | : 10/749022 |
| DATED | : April 3, 2007 |
| INVENTOR(S) | : Sang K. Park |

Page 1 of 1

It is certified that error appears in the above-identified patent and that said Letters Patent is hereby corrected as shown below:

On the First Page:

At field (74), "Marshall Gerstein & Borun" should be -- Marshall, Gerstein & Borun LLP --.

At field (57), "Disclosed in" should be -- Disclosed is --.

In the Claims:

At Column 7, line 2, "convex the top" should be -- convex-top --.

At Column 7, line 4, "flatting" should be -- flattening --.

At column 8, line 1, "tile" should be -- the --.

Signed and Sealed this

Third Day of June, 2008

JON W. DUDAS
*Director of the United States Patent and Trademark Office*